US012571829B2

(12) United States Patent
Wright et al.

(10) Patent No.: US 12,571,829 B2
(45) Date of Patent: Mar. 10, 2026

(54) ELECTRICAL GRID DISCREPANCY IDENTIFICATION

(71) Applicant: Itron, Inc., Liberty Lake, WA (US)

(72) Inventors: Bryan Wright, Newport Coast, CA (US); Thad Stalcup, Alpharetta, GA (US); John Stalcup, Alpharetta, GA (US); Allan Gonzaga, Irvine, CA (US)

(73) Assignee: Itron, Inc., Liberty Lake, WA (US)

( * ) Notice: Subject to any disclaimer, the term of this patent is extended or adjusted under 35 U.S.C. 154(b) by 314 days.

(21) Appl. No.: 18/153,301

(22) Filed: Jan. 11, 2023

(65) Prior Publication Data

US 2023/0221362 A1     Jul. 13, 2023

Related U.S. Application Data

(60) Provisional application No. 63/266,724, filed on Jan. 12, 2022.

(51) Int. Cl.
*G01R 31/08*          (2020.01)
(52) U.S. Cl.
CPC .................................. *G01R 31/086* (2013.01)
(58) Field of Classification Search
CPC ............... G01R 31/086; G01R 19/2513; H02J 2203/10; H02J 13/00002
See application file for complete search history.

(56) References Cited

U.S. PATENT DOCUMENTS

2010/0271222 A1* 10/2010 Kerrigan ........... H02J 13/00016
                                                         702/182
2013/0091258 A1* 4/2013 Shaffer ..................... H02J 3/00
                                                         709/224

2013/0232094 A1* 9/2013 Anderson .......... G05B 23/0281
                                                         706/12
2014/0236365 A1* 8/2014 Martin ................ H04L 43/0847
                                                         700/286
2016/0131501 A1* 5/2016 Steigler ............... G06F 16/2365
                                                         340/870.02

(Continued)

FOREIGN PATENT DOCUMENTS

AU          2015338896 A1 * 4/2017 ........ H02J 13/00006

OTHER PUBLICATIONS

Räsänen: "Feature-Based Clustering for Electricity Use Time Series Data", M. Kolehmainen et al. (Eds.): ICANNGA 2009, LNCS 5495, pp. 401-412, 2009. (© Springer-Verlag Berlin Heidelberg 2009) (Year: 2009).*

(Continued)

*Primary Examiner* — Lisa M Caputo
*Assistant Examiner* — Toni D Sauncy
(74) *Attorney, Agent, or Firm* — Lee & Hayes, P.C.

(57) ABSTRACT

A method for detecting discrepancies in an electrical grid configuration includes receiving network-communicated telemetry data from a plurality of grid monitoring devices of an electrical grid over a computer network. The apparent grid configuration is estimated based at least in part on the network-communicated telemetry data, and compared to a digital documented configuration of the electrical grid stored in computer storage. Based on the comparison, an indication of a potential discrepancy between the apparent grid configuration and the digital documented grid configuration is output.

17 Claims, 9 Drawing Sheets

(56) References Cited

U.S. PATENT DOCUMENTS

| | | | | |
|---|---|---|---|---|
| 2016/0352103 | A1* | 12/2016 | Aiello | ............... H02J 13/00002 |
| 2018/0356449 | A1* | 12/2018 | Léonard | ............... G01R 19/003 |
| 2019/0257867 | A1* | 8/2019 | Biswas | ............. G01R 19/2513 |
| 2020/0106300 | A1* | 4/2020 | Dam | .................... G05B 13/041 |
| 2020/0292608 | A1* | 9/2020 | Yan | ...................... G05B 23/024 |
| 2020/0293032 | A1* | 9/2020 | Wang | .................. G01R 31/086 |

OTHER PUBLICATIONS

Elpis Squared, Description of Applicant's products sold and/or offered for sale prior to Jan. 12, 2021; created on Aug. 12, 2020; 48 pages.

* cited by examiner

200

RECEIVE TELEMETRY DATA FROM GRID
REPORTING DEVICES
202

ESTIMATE AN APPARENT GRID CONFIGURATION
BASED ON THE TELEMETRY DATA
204

COMPARE THE APPARENT GRID CONFIGURATION
TO A DIGITAL DOCUMENTED GRID
CONFIGURATION
206

OUTPUT AN INDICATION OF A POTENTIAL
DISCREPANCY
208

ELECTRICAL GRID DISCREPANCY IDENTIFICATION

CROSS REFERENCE TO RELATED APPLICATIONS

This application claims priority to U.S. Provisional Patent Application No. 63/266,724, filed Jan. 12, 2022, the entirety of which is hereby incorporated herein by reference for all purposes.

BACKGROUND

An electrical grid includes a number of structures and components used to distribute electrical power from a production facility (e.g., power plant) to power consumers, such as commercial or residential customers. Electrical grid components include, as examples, substations, transformers, SCADA (supervisory control and data acquisition) devices, and power meters.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A method for detecting discrepancies in an electrical grid configuration includes receiving network-communicated telemetry data from a plurality of grid monitoring devices of an electrical grid over a computer network. The apparent grid configuration is estimated based at least in part on the network-communicated telemetry data, and compared to a digital documented configuration of the electrical grid stored in computer storage. Based on the comparison, an indication of a potential discrepancy between the apparent grid configuration and the digital documented grid configuration is output.

DETAILED DESCRIPTION

The techniques described herein relate to identifying discrepancies between the digital documented configuration of an electrical grid stored in computer storage, and the apparent configuration of the electrical grid estimated based on telemetry data. For instance, as will be described in more detail below, the connectivity between different electrical grid assets (e.g., substations, transformers, electrical meters) may change over time in ways that are not consistently documented. For example, after a power outage, a local portion of a grid may be reconfigured in order to restore customer power, and this reconfiguration is sometimes not properly recorded and used to update the documented grid configuration. Thus, it can be difficult for an electrical grid operator or regulator to identify with confidence which assets are connected to which other assets, and this can complicate attempts to perform grid maintenance, renovation, and/or expansion.

As such, according to the present disclosure, telemetry data reported by various grid reporting devices (e.g., power meters, supervisory control and data acquisition (SCADA) devices) may be collected and analyzed to estimate the apparent configuration of the power grid. For instance, characteristic feature curves for various grid components may be estimated and compared to one another—e.g., to validate the phase of grid assets, and/or establish meter-transformer clusters. From there, discrepancies between the apparent grid configuration and the digital documented configuration of the power grid may be identified and reported, thereby enabling the discrepancies to be resolved—e.g., by changing records to match the actual arrangement of the grid, or by changing the configuration of the grid to match the original specification.

Figure 1:
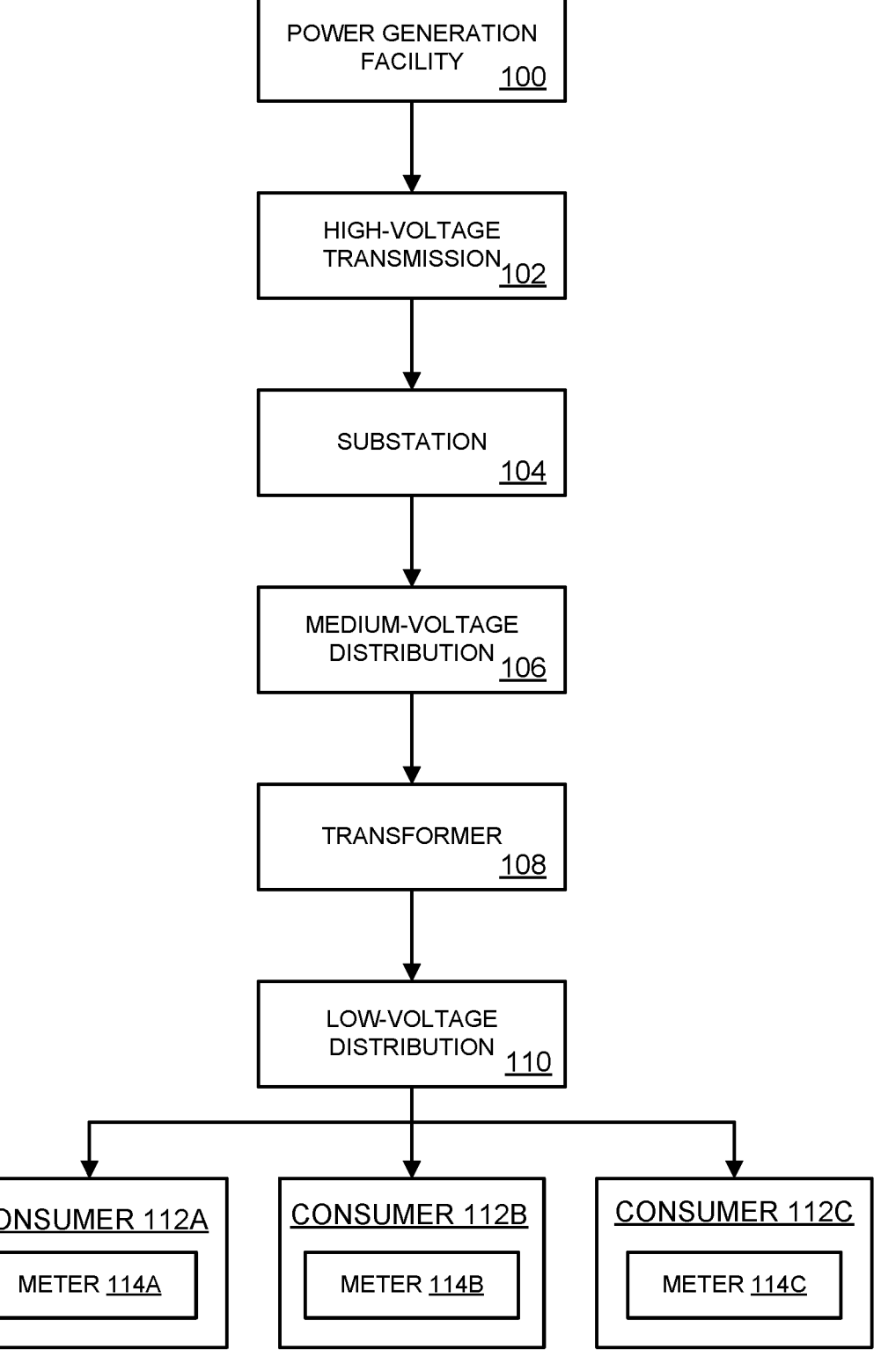
FIG. 1 schematically illustrates distribution of electrical power from a power generation facility to a plurality of consumers.

FIG. 1 schematically depicts various systems and assets involved in electrical power distribution. It will be understood that FIG. 1 is deliberately simplified and intended only to illustrate one example hierarchy of assets that may be used to facilitate power distribution from a generation facility to a plurality of individual consumers. It will be understood that the techniques described herein may be applied to electrical grids implemented in any variety of different suitable ways, using any suitable topologies. Furthermore, the techniques described herein may be applied regardless of the size of the electrical grid—e.g., whether the grid is a local grid, regional grid, or national grid.

FIG. 1 schematically depicts an electrical power generation facility 100, which generates electrical power for transmission and distribution to, and eventual use by, a plurality of individual consumers. The power generation facility may take any form and generate electrical power in any suitable way. As non-limiting examples, the power generation facility may be a coal-fired power plant, natural gas-fired power plant, nuclear power plant, geothermal power plant, hydroelectric power plant, solar power plant, wind power plant, tidal power plant, etc. Furthermore, the power generation facility may in some cases generate power using two or more different modalities.

Electrical power generated by the power generation facility is transmitted via a high-voltage transmission network 102. This may include, for example, overhead power lines (e.g., suspended between vertical poles), and/or below-ground power lines (e.g., transmission lines disposed within underground conduits). The term "high-voltage" indicates that the transmission voltage is relatively higher than the voltage at which the electrical power is ultimately received by the consumers—e.g., the transmission voltage may be 110 kV or higher. In some cases, the voltage of the electrical power outbound from the power generation facility may be stepped up via one or more suitable power transformers prior to transmission via the high-voltage transmission network. The electrical power may be transmitted via AC—e.g., three-phase AC. In some examples, direct current (DC) may instead be used.

Power transmitted via the high-voltage transmission network may be received at each of a plurality of substations, one of which is schematically depicted in FIG. 1 as substation 104. Each substation may function to step-down the voltage of the electrical power from the high-voltage transmission network to a medium voltage for distribution. An electrical power grid may have any suitable number of different substations connected to the high-voltage transmission network—e.g., each located in a different area or region.

From each substation, the electrical power is distributed via a medium-voltage distribution network 106. Again, this may include overhead power lines and/or below-ground power lines. The term "medium-voltage" indicates that the voltage of the electrical power is lower than the transmission voltage, though still higher than the final voltage at which the electrical power is delivered to the consumers. As one example, the voltage used during medium-voltage distribution may be between 2 kV and 35 kV.

In some examples, electrical power distributed via the medium-voltage distribution network may be received at each of a plurality of power transformers, one of which is schematically depicted in FIG. 1 as a transformer 108. Each transformer may be configured to further step-down the voltage of the electrical power for delivery to each of a plurality of individual consumers. Transformers may include pole-mount transformers, pad-mount transformers, and/or any other suitable transformers. In cases where the medium-distribution network utilizes three-phase AC, each transformer may be connected to one or more wires corresponding to one or more of the three phases. In other words, transformers may be one-phase transformers (connected to one phase of the three-phase AC), two-phase transformers, and/or three-phase transformers.

From each transformer, electrical power may be distributed to a plurality of individual consumers via a low-voltage distribution network 110. "Low-voltage" may correspond to the final voltage at which the electrical power is received by the consumers—e.g., 120V/240V in the United States. Again, the low-voltage distribution network may include any suitable combination of overhead lines, below-ground lines, and/or other suitable wiring configurations for power delivery.

In FIG. 1, electrical power from the low-voltage distribution network is received by a plurality of different consumers, including consumers 112A, 112B, and 112C. Though only three consumers are schematically depicted in FIG. 1, it will be understood that electrical power from the power generation facility may be delivered to any suitable number of individual consumers. In some cases, the electrical power grid may use a branching tree structure. For instance, any suitable number of substations may be connected to the high-voltage transmission network, any suitable number of transformers may be coupled to each medium-voltage distribution network branching away from a substation, and any suitable number of different customers may draw power from each transformer. Thus, the power delivery infrastructure branching away from power generation facility 100 may ultimately terminate at a plurality of different consumers.

As used herein, an electrical power consumer may include any suitable party that draws and uses electrical power from the power grid. This may include, as examples, residential customers (e.g., houses, apartment buildings, condominiums), public buildings (e.g., schools, utilities), commercial facilities (e.g., stores, warehouses, data centers), industrial facilities (e.g., factories), energy storage facilities (e.g., battery arrays), charging stations (e.g., for charging electric vehicles), etc. Furthermore, in the example of FIG. 1, each of the consumers draws power from the low-voltage distribution network. In other examples, one or more consumers may draw power from other levels of the power grid hierarchy—for instance, if their voltage needs are higher than the low-voltage distribution network supports.

In FIG. 1, each of the consumers 112A, 112B, and 112C is associated with a respective power meter 114A, 114B, and 114C. These meters may track the amount of power drawn by each consumer connected to the power grid. For instance, data collected by the power meters may be used by the power grid operator for billing purposes, for diagnostic purposes, to collect telemetry data, etc.

In general, the power grid operator may specify and document the configuration and connectivity of power grid assets during construction—e.g., the geographic locations of different meters, which meters are connected to which transformers, which electrical phase different transformers are connected to (e.g., in the case of one-phase or two-phase transformers), and the arrangement of SCADA devices with respect to other grid assets. However, as discussed above, the actual configuration of the power grid can sometimes diverge from the documented configuration as time passes. For instance, during a power outage, work crews may make emergency repairs in which assets are connected to different phase wires, meters are connected to different transformers, and/or various assets may be physically moved to different geographic locations. These changes may not always be thoroughly documented, meaning the power grid operator may have relatively limited insight into the actual configuration of the power grid beyond a certain level of granularity—e.g., below the substation level.

Figure 2:
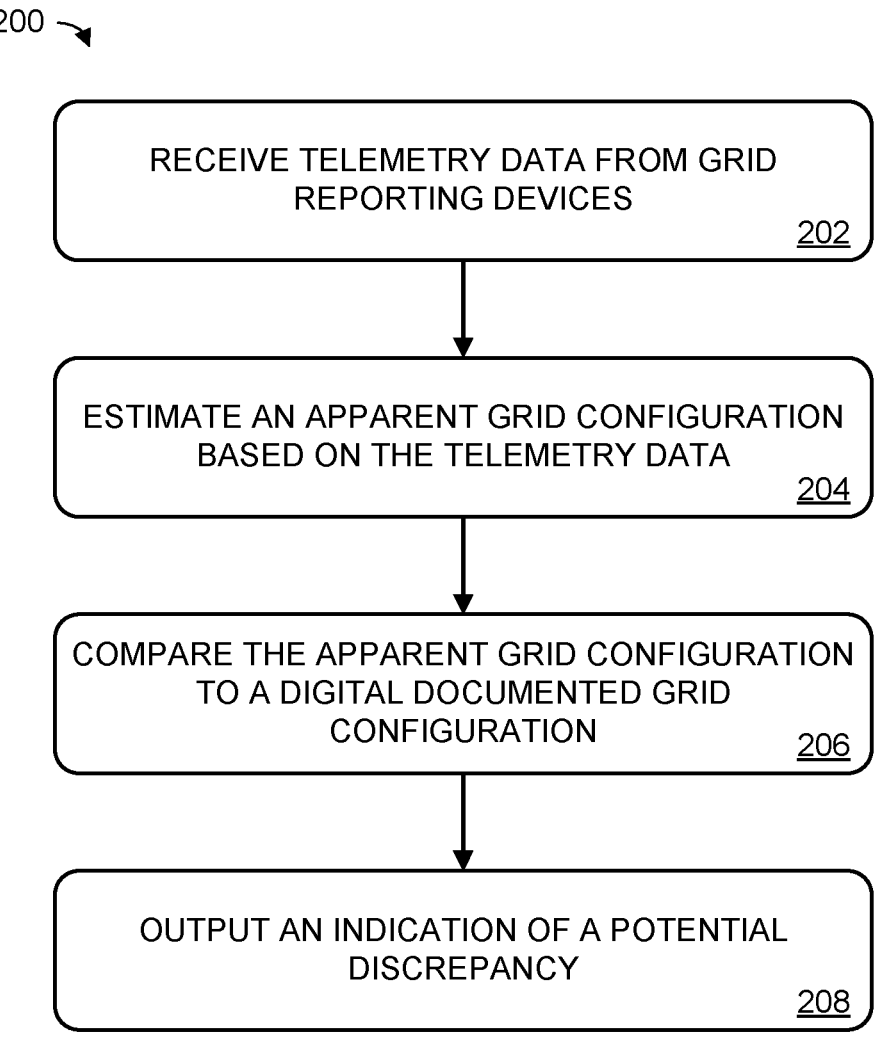
FIG. 2 illustrates an example method for detecting discrepancies in an electrical grid configuration.

As such, FIG. 2 illustrates an example method 200 for identifying discrepancies between the digital documented configuration of an electrical power grid as stored in computer storage, and the apparent configuration of the grid as derived from telemetry data. Method 200 may be implemented by a computing system of one or more computing devices. For instance, method 200 may be implemented by a computing system operated by a power grid operator or regulator. As another example, method 200 may be implemented by a company or organization that provides analytics services to power grid operators. Any computing devices implementing method 200 may have any suitable form factor, capabilities, and hardware configuration. In some examples, method 200 may be implemented as computing system 800 described below with respect to FIG. 8.

Furthermore, it will be understood that method 200 is a simplified, high-level process. Each individual step of method 200 may be associated with one or more sub-processes or intermediary processes. In other implementations, some steps of method 200 may be omitted, and/or one or more additional or alternative steps may be performed.

At 202, method 200 includes, at a grid evaluation computing system, receiving network-communicated telemetry data from a plurality of grid reporting devices of an electrical grid over a computer network. Such reporting devices may include, as non-limiting examples, power meters, SCADA devices (e.g., capacitor banks, reclosers, line regulators, load tap changers, remote terminal units), and/or any other suitable devices and sensors capable of providing telemetry data relevant to the current configuration of a power grid. The telemetry data may include, as non-limiting examples, voltages and/or electrical loads (e.g., currents) measured by the different reporting devices, the current geographic locations of the reporting devices (e.g., as measured by global positioning system sensors), unique identifiers of the reporting devices, measured temperatures, humidity data, diagnostic data (e.g., specifying one or more error codes, indicating a recent loss in power, or indicating a current uptime of the reporting device), etc. The present disclosure primarily focuses on voltage and/or current data reported by the grid reporting devices, although it will be understood that any variety of suitable information may be received and analyzed in addition to, or instead of, voltage/current data.

The telemetry data may be received from the grid reporting devices in any suitable way. For instance, telemetry data may be received over a computer network. As one non-limiting example, a computing system implementing method 200 may receive telemetry data from the plurality of grid reporting devices over the Internet.

Figure 3:
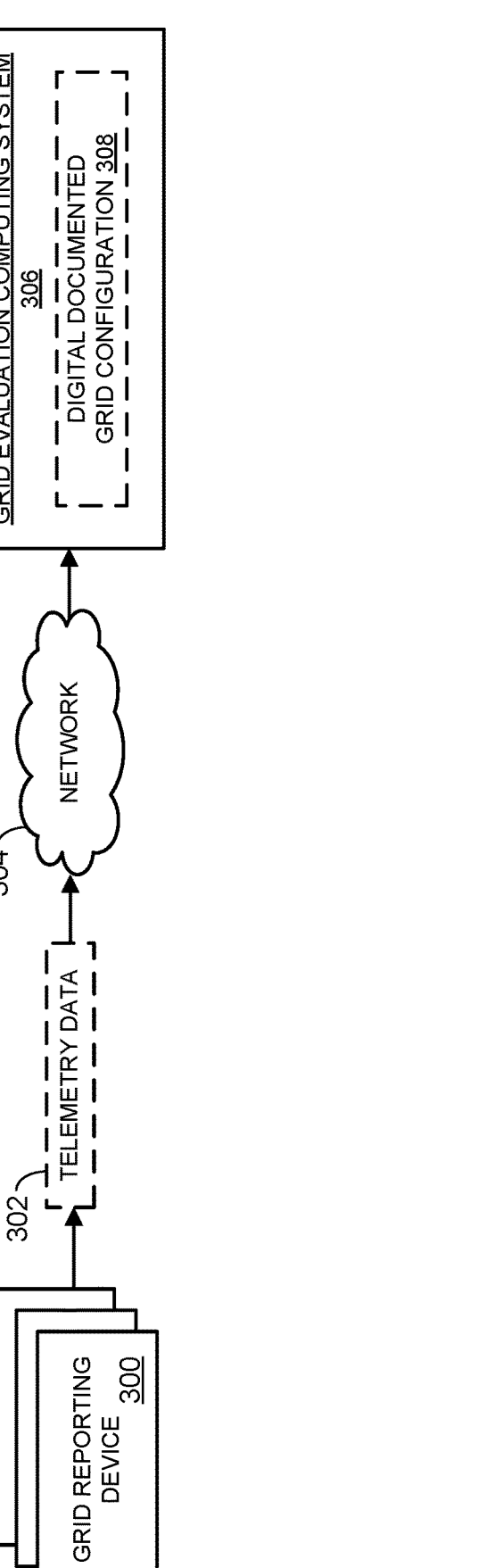
FIG. 3 schematically illustrates receiving network-communicated telemetry data from grid reporting devices.

This is schematically illustrated with respect to FIG. 3, showing a plurality of grid reporting devices 300. The grid reporting devices output telemetry data 302, which is transmitted over a computer network 304 to a grid evaluation computing system 306. As one example, grid evaluation computing system 306 is implemented as computing system 800 described below with respect to FIG. 8. The grid evaluation computing system stores a digital documented grid configuration 308. As discussed above, this specifies the original configuration of the power grid as designed, and may or may not be consistent with the actual configuration of the power grid at any given time (e.g., due to undocumented changes made to the grid configuration during maintenance or emergency repairs).

Telemetry data may be received at any time—e.g., a particular grid reporting device may provide telemetry data at a predefined frequency or at irregular intervals (such as in response to detecting certain events or conditions). Different grid reporting devices need not each report telemetry data at the same time or frequency—e.g., one grid reporting device may provide telemetry data every hour, while another provides data every minute, and a third provides telemetry data only upon a predefined condition (such as an error state) being detected.

In some examples, the network-communicated telemetry data is normalized prior to use in estimating the apparent configuration of the electrical grid. This may include any suitable operations for processing or manipulating the telemetry data, so as to enable comparisons between sets of telemetry data received from different grid reporting devices. As one example, normalizing the telemetry data may include time-synchronization between sets of telemetry data received from different reporting devices. In other words, normalizing the network-communicated telemetry data may include time-synchronizing first telemetry data from a first grid reporting device with second telemetry data from a second grid reporting device.

For instance, one or more of the plurality of grid reporting devices may have internal clocks (or other timekeeping functions) that are not synchronized with others of the plurality of grid reporting devices. Thus, for example, the same change in voltage detected by two different grid reporting devices at substantially the same time may be associated with different time stamps in sets of telemetry data reported by the two different reporting devices. As such, normalizing the telemetry data may include aligning different sets of telemetry data to the same common time frame. In other words, time-synchronizing the first telemetry data with the second telemetry data may include identifying corresponding time-domain signal peaks in the first telemetry data and the second telemetry data, and time-shifting either or both of the first telemetry data and the second telemetry data to align the corresponding time-domain signal peaks.

Figure 4A:
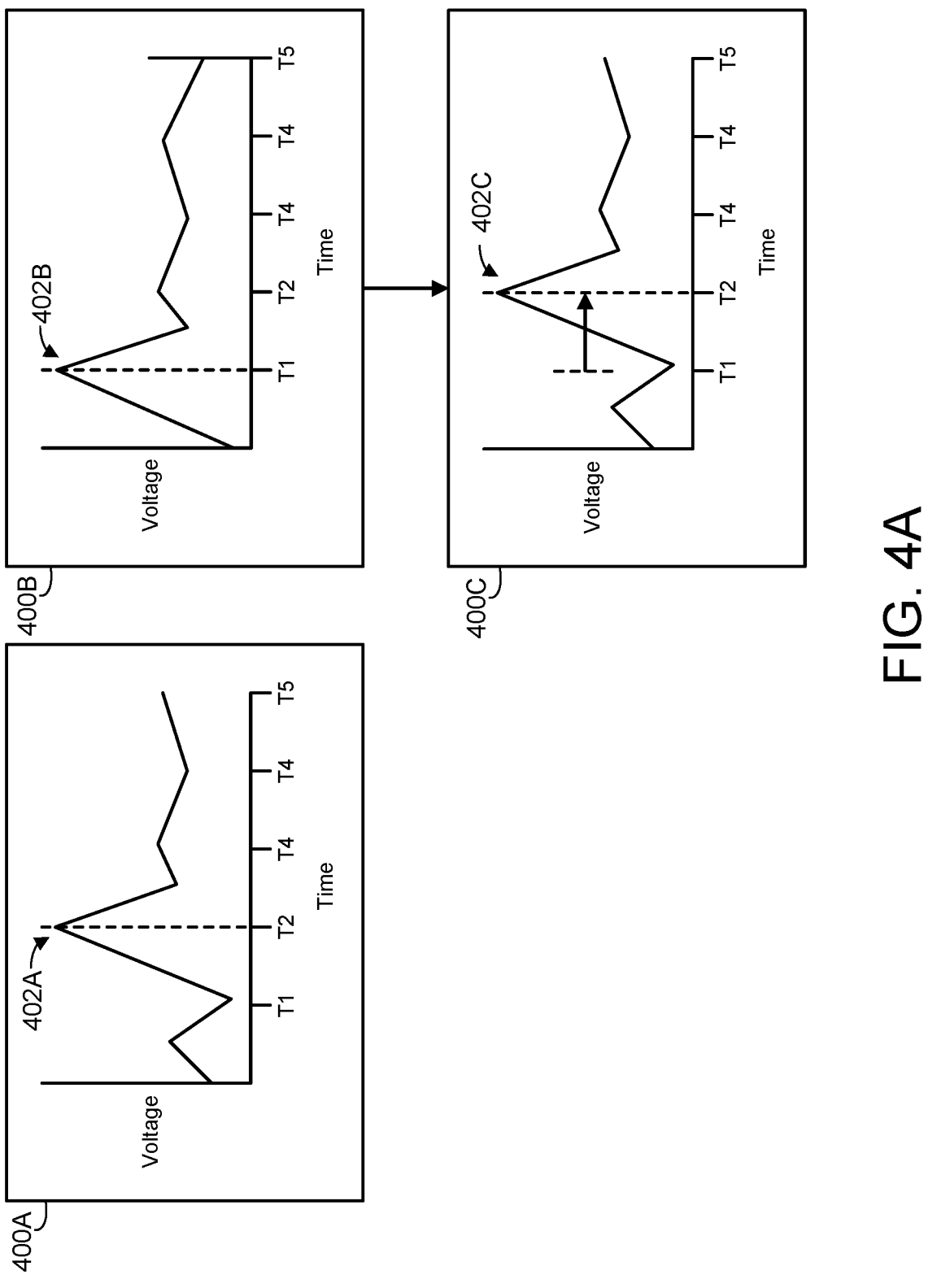
FIGS. 4A and 4B schematically illustrate normalizing network-communicated telemetry data.

This is schematically illustrated with respect to FIG. 4A, which shows different sets of simplified telemetry data. In this example, the telemetry data reflects time-domain changes in voltage, although it will be understood that this is non-limiting. As shown, a first set of telemetry data 400A and a second set of telemetry data 400B each include respective time-domain signal peaks 402A and 402B, reported at different times. Thus, in this example, the second set of telemetry data 400B is normalized to give a normalized set of telemetry data 400C, including a time-domain signal peak 402C that has been time-shifted to align with the time-domain signal peak 402A in the first set of telemetry data 400A.

As another non-limiting example, normalizing the telemetry data may include filling any gaps in the telemetry data. In some examples, this includes identifying a gap in telemetry data reported by a grid reporting device, and filling the gap with synthetic telemetry data derived from prior telemetry data received by the grid evaluation computing system. For instance, a power outage may prevent one or more grid reporting devices from collecting telemetry data for some length of time. Thus, in some examples, the computing system may attempt to supplement the telemetry data with synthetic data derived from historical trends. For instance, if a power meter corresponding to a particular consumer fails to report telemetry data over a window of time due to a power outage, the computing system may estimate what the power usage would have been had no power outage occurred—e.g., based on typical patterns of use at that address, the current outdoor temperature, and/or the current outdoor weather conditions.

Figure 4B:
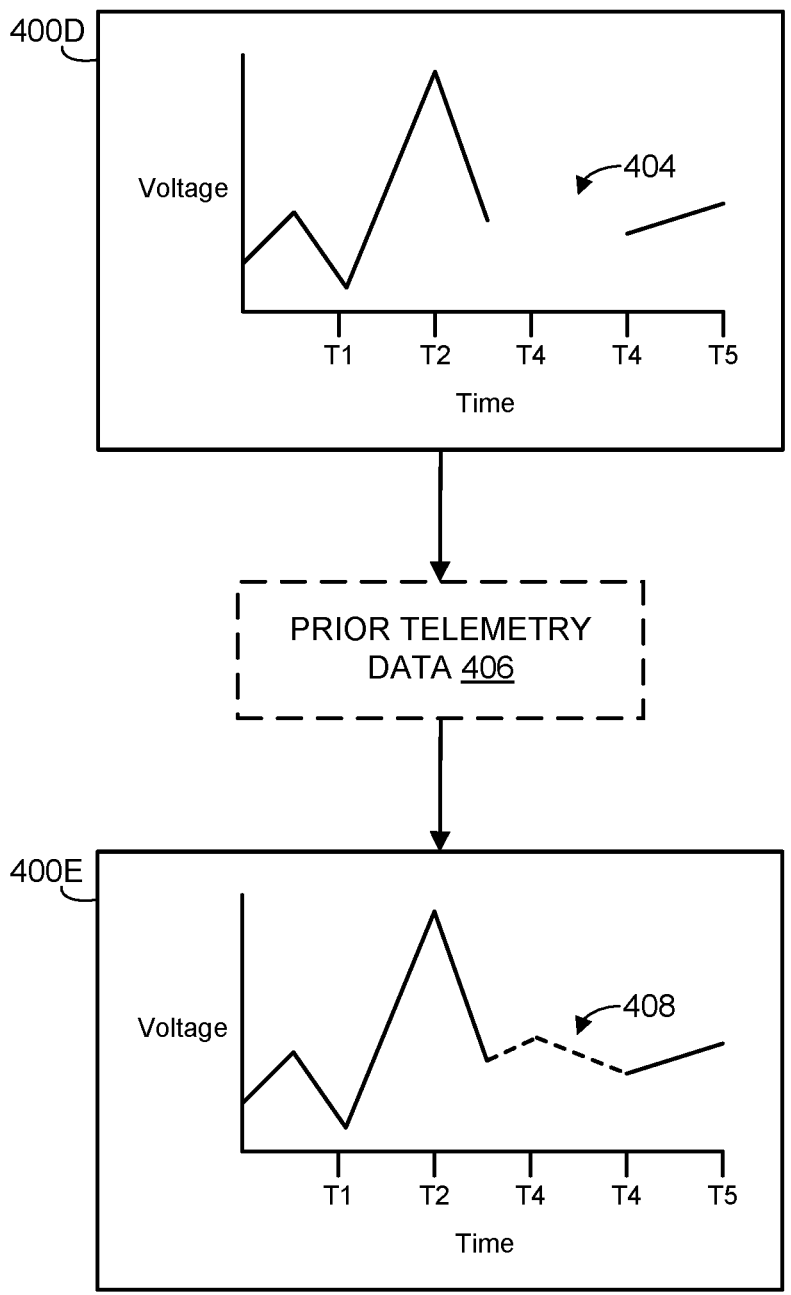

This is schematically illustrated with respect to FIG. 4B, showing another simplified set of telemetry data 400D. In this example, the telemetry data includes a gap 404. As such, based at least in part on prior telemetry data 406, the grid evaluation computing system outputs a set of normalized telemetry data 400E in which the gap is filled with synthetic data 408, derived from the prior telemetry data 406.

Figure 5:
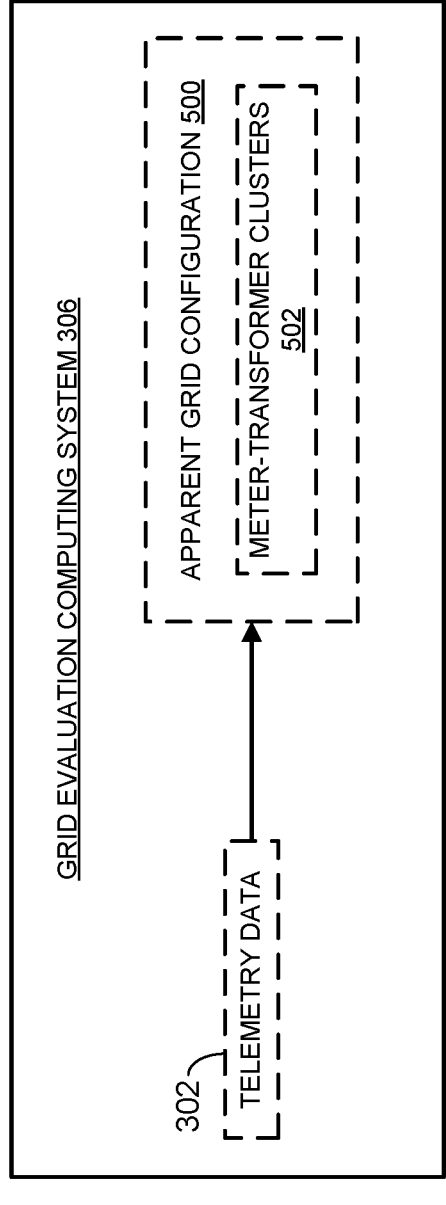
FIG. 5 schematically illustrates estimating an apparent grid configuration of an electrical grid.

Returning briefly to FIG. 2, at 204, method 200 includes estimating an apparent grid configuration of the electrical grid based at least in part on the network-communicated telemetry data. The apparent grid configuration includes a plurality of meter-transformer clusters, each meter-transformer cluster including a respective electrical transformer and a plurality of power meters associated with the electrical transformer. This is schematically illustrated with respect to FIG. 5, again showing grid evaluation computing system 306. In this example, the computing system estimates an apparent grid configuration 500 of the electrical grid based at least in part on telemetry data 302. As shown, the apparent grid configuration includes one or more meter-transformer clusters 502.

In some examples, estimating the apparent grid configuration includes validating the phase of any or all power grid assets for which telemetry data is available. This may include validating the phase of grid assets (e.g., confirming that those assets are still connected to the same phase as is indicated in grid records), and/or discovering the phase of grid assets (e.g., evaluating telemetry data to determine the phase of any assets that do not already have a phase recorded). In other words, estimating the apparent grid configuration includes, in some examples, validating an electrical phase for a grid component of the electrical grid by verifying that an apparent electrical phase for the grid component matches a recorded electrical phase for the grid component in the digital documented grid configuration. In some examples, validating the electrical phase includes identifying the electrical phase for a grid component previously having no electrical phase recorded in the digital documented grid configuration. In some cases, phase validation may begin with SCADA assets associated with the medium-voltage distribution network. Once the phase of these medium-voltage SCADA assets is discovered and/or validated, data associated with each SCADA asset may be used as a baseline for validating and/or discovering the phase of low-voltage assets—e.g., transformers.

In some cases, the phase validation process may be performed in conjunction with suitable machine-learning (ML) and/or artificial intelligence (AI) techniques. As non-limiting examples, the techniques described herein may be implemented via one or more of a preprocessing min-max scaler, a scale man variance model, a linear regression model, and/or a feature correlation model (e.g., Pearson feature correlation). Additional non-limiting examples of suitable ML and/or AI techniques are given below with respect to FIG. 8.

In some cases, estimating the apparent grid configuration includes generating characteristic feature curves for a plurality of grid components of the electrical grid, based at least in part on the network-communicated telemetry data. This can include generating characteristic feature curves for SCADA devices, low-voltage transformers, and/or power meters of the plurality of grid components. A characteristic feature curve may be a composite of a given set of time-based telemetry data, as output by a machine-learning process. For instance, the feature curves may be determined based on any or all of each asset's location, the current weather, and/or the current season, in conjunction with the voltage/current data. Feature curves may be representative of any suitable length of time—e.g., a day, week, month, or year.

Figure 6A:
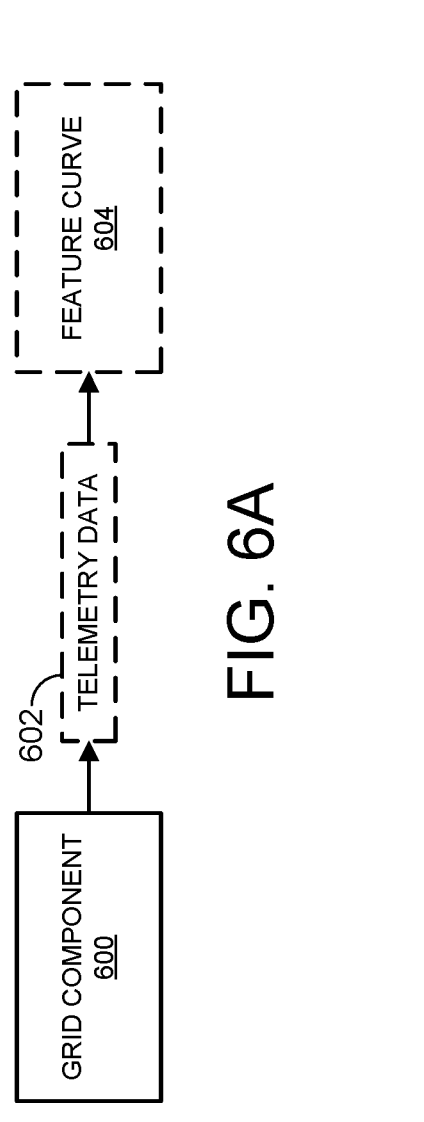
FIGS. 6A and 6B schematically illustrate generating characteristic feature curves for grid components of an electrical grid.
Figure 6B:
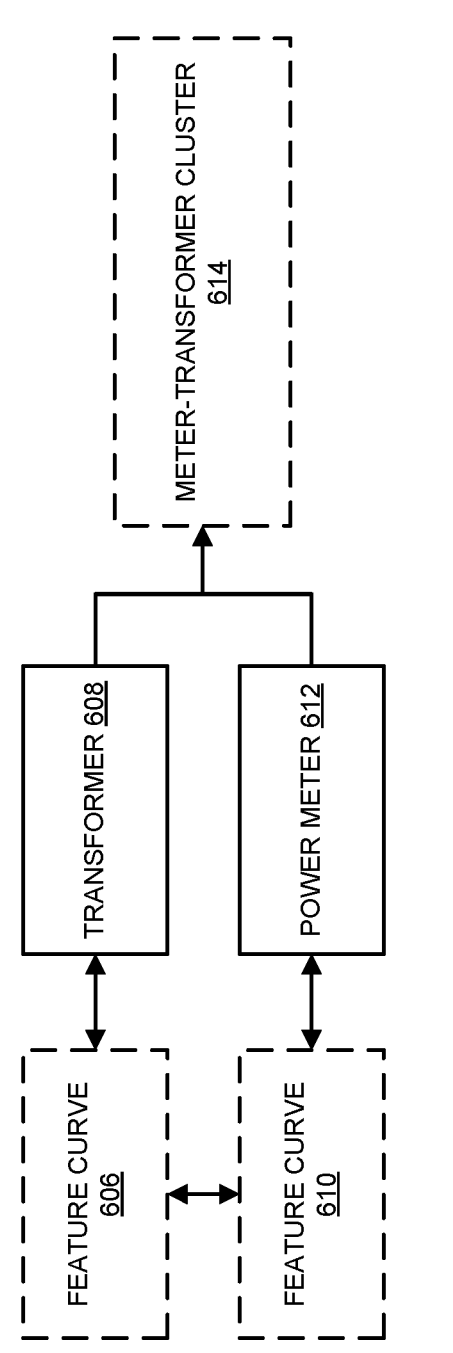

Feature curve generation is schematically illustrated with respect to FIGS. 6A and 6B. Specifically, as shown, a grid component (e.g., SCADA device, transformer, power meter) outputs telemetry data 602. The telemetry data is used to generate a characteristic feature curve 604 for the grid component as discussed above—e.g., as a composite of a given set of time-based telemetry data output by a machine-learning process.

In some examples, after generating characteristic feature curves for medium-voltage SCADA assets, similar feature curves may be generated for low-voltage transformers. In some cases, this may be done via a two-step process—e.g., generating a characteristic feature curve for a low-voltage transformer includes generating a composite feature curve by combining two substituent feature curves for the low-voltage transformer. In one example process, the two substituent feature curves include a first substituent feature curve derived from a characteristic feature curve generated for a SCADA device that the low-voltage transformer is connected to according to the digital documented grid configuration. For instance, the computing system may identify the closest SCADA asset to each transformer (e.g., based on the digital documented configuration of the electrical grid), and derive a feature curve for each transformer based at least in part on the feature curve previously determined for the SCADA asset. A second substituent feature curve may be derived from network-communicated telemetry data reported by power meters that the low-voltage transformer is connected to according to the digital documented grid configuration. In other words, the computing system may independently derive a second feature curve for each transformer based on voltage/current data reported by a plurality of power meters that are connected to the transformer, again based on the documented configuration of the power grid. The computing system may then combine the two feature curves for each transformer to generate single composite feature curve for each transformer.

After deriving the composite feature curves for each transformer, the computing system may derive feature curves for each individual power meter. As will be discussed in more detail below, feature curves for power meters, transformers, and/or SCADA assets may be compared to one another—e.g., to identify potential discrepancies between the documented configuration of the power grid and the apparent configuration. Furthermore, in some cases, the computing system may generate updated feature curves for each power meter on a regular basis—e.g., once per day. In other words, the computing system may sequentially generate updated characteristic feature curves for the plurality of grid components over time. For instance, on any given day, a power meter may be moved to a new location (e.g., connected to a different transformer), and/or the configuration of the power grid may change in some other way. Thus, by sequentially generating new feature curves for each power meter on a regular or irregular basis, such configuration changes may be detected.

In some examples, the characteristic feature curves are used to identify meter-transformer clusters in the apparent grid configuration—e.g., identifying clusters of two or more power meters connected to each transformer. In other words, in some examples, estimating the apparent grid configuration includes comparing the characteristic feature curve for a low-voltage transformer of the plurality of grid components to characteristic feature curves for one or more power meters of the plurality of grid components. Any of the one or more power meters having higher than a threshold similarity to the low-voltage transformer may then be assigned to a same meter-transformer cluster as the low-voltage transformer, as will be described in more detail below.

More generally, in some examples, the computing system uses some or all of the above-described data to evaluate the current apparent configuration of the power grid—e.g., the connectivity between substations, SCADA assets, transformers, power meters, and/or any other suitable grid assets. In this manner, the computing system may identify potential discrepancies between the documented configuration of the power grid, and its apparent current configuration, as will be described in more detail below.

In some cases, the computing system may use geofencing and locational constraints to bound a geographic area surrounding a transformer deemed as being likely to include all power meters connected to that transformer. In other words, in some examples, the one or more power meters compared to the low-voltage transformer are selected by identifying power meters having recorded geographic locations in the digital documented grid configuration falling within a threshold distance of a recorded geographic location of the low-voltage transformer in the digital documented grid configuration. For instance, the computing system may determine that an expected decrease in voltage between a transformer and power meter, calculated based at least in part on expected line resistance, imposes a limit on the potential maximum geographic distance between the transformer and power meter. From there, the computing system may identify any power meters recorded as falling within the bounded geographic area according to the documented configuration of the power grid.

Feature curves for the identified power meters may be compared to the composite feature curve for the transformer to evaluate the relative similarity between electrical conditions at the transformer and electrical conditions at the identified power meters. In some cases, any identified power meters having feature curves with higher than a threshold similarity with the composite feature curve of the transformer (e.g., as computed via a suitable feature correlation algorithm) may be added to a cluster corresponding to that transformer. In other words, these power meters may be validated as actually being connected to the transformer.

This is schematically illustrated with respect to FIG. 6B, showing a characteristic feature curve 606 corresponding to an electrical transformer 608. Feature curve 606 is compared to a different characteristic feature curve 610 corresponding to a power meter 612. Based at least in part on determining that the feature curve of the power meter has higher than a threshold similarity to the feature curve of the transformer, the power meter and transformer are each assigned to a same meter-transformer cluster 614.

However, in some cases, one or more power meters may have a lower-than-threshold similarity with the transformer to which they are initially compared. This may indicate that the power meter is connected to a different transformer than its recorded geographic location would indicate. For instance, the power meter may have been physically moved to a new location and connected to a different transformer. Alternatively, the power meter may still at the same location, although connected to a different transformer—e.g., as a result of undocumented repairs.

In other words, in some examples, comparing the apparent grid configuration to the digital documented grid configuration includes determining that a power meter assigned to the same meter-transformer cluster as a low-voltage transformer in the documented grid configuration has a recorded geographic location in the digital documented grid configuration that is inconsistent with a recorded geographic location of the low-voltage transformer, based on one or more geographical constraints. This indicates, for instance, that the recorded geographic locations of either or both of the power meter and the low-voltage transformer are incorrect in the digital documented grid configuration. As such, the computing system may attempt to identify the transformer that the power meter is actually connected to. This includes, in some examples, comparing the characteristic feature curve for the power meter to characteristic feature curves for one or more other low-voltage transformers, and assigning the power meter to a meter-transformer cluster including a low-voltage transformer of the one or more other low-voltage transformers having higher than the threshold similarity with the power meter.

In any case, any or all of the data described above is used to estimate an apparent configuration of the electrical power grid, where the apparent configuration includes a plurality of meter-transformer clusters. As discussed above, the apparent configuration may differ from the digital documented configuration of the power grid in any number of ways—e.g., including transformers that are apparently connected to a different collection of power meters than is indicated in the digital documented grid configuration.

Figure 7:
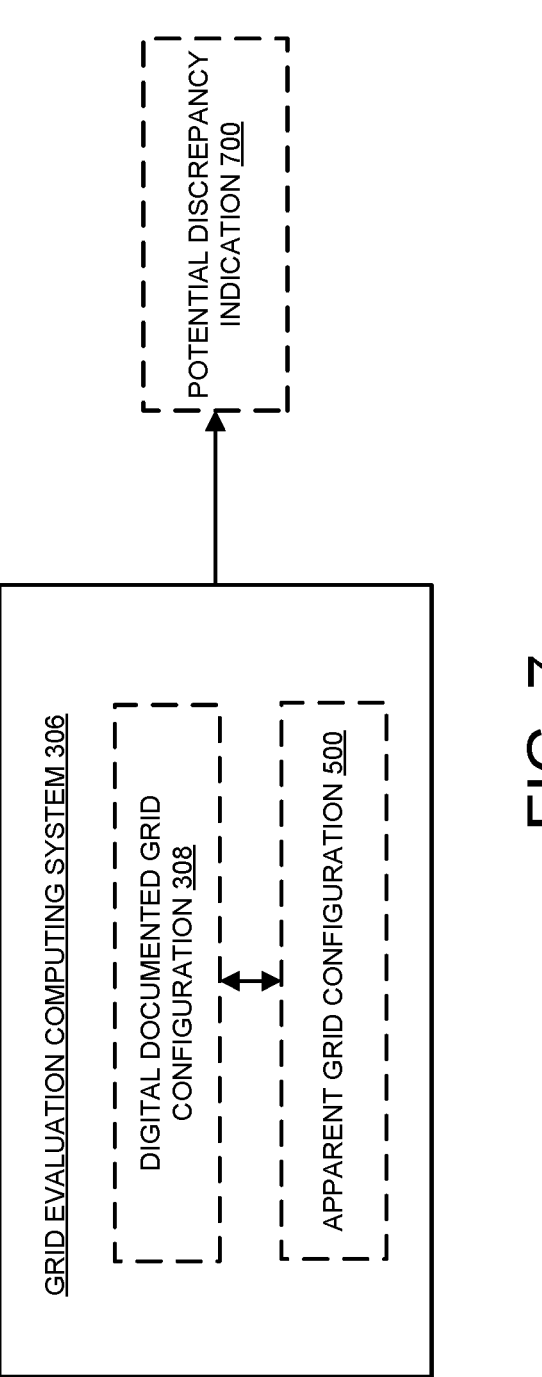
FIG. 7 schematically illustrates outputting an indication of a potential discrepancy between an apparent grid configuration and a digital documented grid configuration.

As such, returning briefly to FIG. 2, method 200 includes, at 206, comparing the apparent grid configuration to the digital documented grid configuration of the electrical grid stored in computer storage. At 208, method 200 includes outputting an indication of a potential discrepancy between the apparent grid configuration and the digital documented grid configuration based on the comparison. This is schematically illustrated with respect to FIG. 7, again showing grid evaluation computing system 306. In this example, the computing system compares the digital documented grid configuration 308 to the apparent grid configuration 500, and outputs an indication 700 of a potential discrepancy.

For instance, the computing system may identify one or more power meters as potentially not connected to the transformers to which they are recorded as being physically nearby. From there, the computing system may compare feature curves for each of the flagged power meters to one or more other transformers—e.g., to identify a transformer that the power meter is likely actually connected to in the power grid's current configuration. In other words, in some examples, the indication of the potential discrepancy indicates that either or both of the recorded geographic location of the power meter and the recorded geographic location of the low-voltage transformer is inconsistent with the apparent grid configuration of the electrical grid.

Furthermore, as discussed above, the computing system may generate feature curves for transformers (e.g., composite feature curves), SCADA assets, and/or any other suitable grid assets. Thus, feature curves for any two grid assets can potentially be compared to infer and/or validate the connectivity between those two assets. For instance, upon generating a composite feature curve for a transformer, the composite curve may be compared to feature curves corresponding to one or more SCADA assets associated with the transformer. In the event that a transformer is identified as not having a strong correlation with an associated SCADA reference, the computing system may try to correlate that transformer with feature curves corresponding to SCADA devices on other feeders. Thus, as another non-limiting example, in some cases the indication of the potential discrepancy indicates that a grid component is connected to a different electrical phase in the apparent grid configuration from a recorded electrical phase in the digital documented grid configuration, based at least in part on the network-communicated telemetry data. Additionally, or alternatively, in some examples the indication of the potential discrepancy indicates that a first grid component connected to a second grid component in the apparent grid configuration is not recorded as being connected to the second grid component in the digital documented grid configuration.

As discussed above, method 200 is deliberately simplified and non-limiting. In other examples, one or more steps of method 200 may be omitted or replaced, and/or one or more additional steps may be included that are not explicitly described herein. Furthermore, each individual step of method 200 may comprise any suitable number of subprocesses.

Any or all of the herein-described methods and processes may be implemented as an executable application, a network-accessible service, an application-programming interface (API), a library, and/or any other suitable computer resources or combinations of computer resources.

Figure 8:
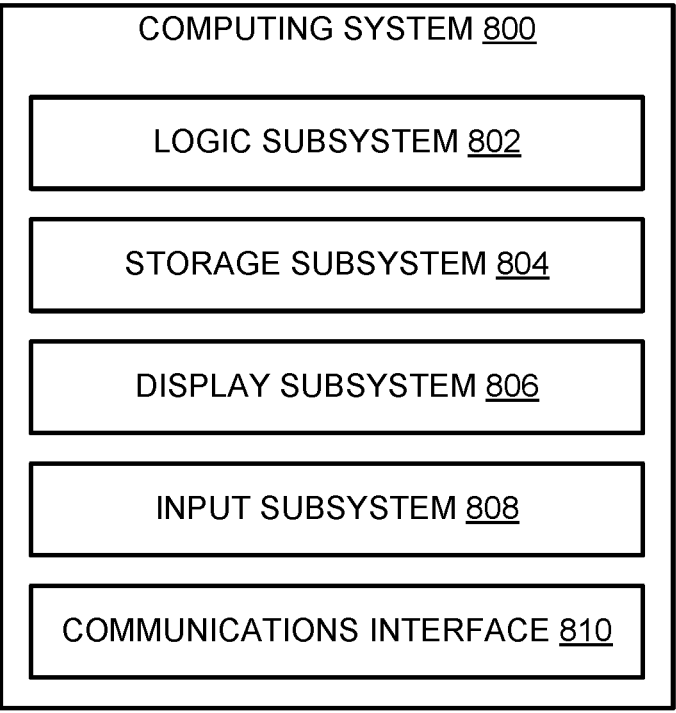
FIG. 8 schematically shows an example computing system.

FIG. 8 schematically shows a simplified representation of a computing system 800 configured to perform any or all of the techniques described herein. Computing system 800 may take the form of one or more personal computers, network-accessible server computers, mobile computing devices, mobile communication devices (e.g., smart phone), Internet of Things (IoT) devices, embedded computing devices, and/or other computing devices.

Computing system 800 includes a logic subsystem 802 and a storage subsystem 804. Computing system 800 may optionally include a display subsystem 806, input subsystem 808, communication subsystem 810, and/or other subsystems not shown in FIG. 8.

Logic subsystem 802 includes one or more physical logic devices configured to execute computer instructions. For example, the logic subsystem may include hardware elements configured to execute instructions that are part of one or more software applications or other executable data constructs, and/or the logic subsystem may include one or more hardware or firmware elements configured to execute hardware or firmware instructions. Processors of the logic subsystem may have any suitable number of cores, and may execute instructions via sequential, parallel, and/or distributed processing. Individual components of the logic subsystem optionally may be distributed among two or more separate devices, which may in some cases be remotely located. In some cases, aspects of the logic subsystem may be virtualized and executed by remotely-accessible, networked computing devices—e.g., configured in a cloud-computing configuration.

Storage subsystem 804 includes one or more physical storage devices configured to temporarily and/or permanently hold computer information—e.g., instructions executable by the logic subsystem, and/or other suitable data. When the storage subsystem includes two or more devices, the devices may be collocated and/or remotely located. Storage subsystem 804 may include volatile, non-volatile, dynamic, static, read/write, read-only, random-access, sequential-access, location-addressable, file-addressable, and/or content-addressable devices. Storage subsystem 804 may include removable and/or built-in devices. In some cases, execution of instructions by the logic subsystem may change the data stored by the storage subsystem—e.g., to store new data.

In some cases, any or all aspects of logic subsystem 802 and/or storage subsystem 804 may be integrated together into one or more hardware-logic components. Such hardware-logic components may include program- and application-specific integrated circuits (PASIC/ASICS), program- and application-specific standard products (PSSP/ASSPs), system-on-a-chip (SOC), and complex programmable logic devices (CPLDs), for example.

The logic subsystem and the storage subsystem may cooperatively implement one or more logic machines. As used herein, the term "machine" is used generally to refer to the combination of computer hardware, firmware, software, instructions, and/or any other components that together provide computer functionality. In other words, "machines" are never abstract ideas and always have a tangible form. A machine may be instantiated by a single computing device, or a machine may be distributed between components of two or more different computing devices. A machine may include a local component (e.g., software application executed by a local computer processor) cooperating with a remote component (e.g., a network-accessible service provided by one or more remote computing devices).

Machines may be implemented using any suitable combination of state-of-the-art and/or future machine-learning (ML) and/or artificial intelligence (AI) techniques. Non-limiting examples of techniques that may be incorporated in an implementation of one or more machines include support vector machines, multi-layer neural networks, convolutional neural networks, recurrent neural networks (e.g., long short-term memory networks), associative memories (e.g., lookup tables, hash tables, Bloom Filters, Neural Turing Machine and/or Neural Random Access Memory), word embedding models (e.g., GloVe or Word2Vec), unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases).

In some examples, the methods and processes described herein may be implemented using one or more differentiable functions. A gradient of the differentiable functions may be calculated and/or estimated with regard to inputs and/or outputs of the differentiable functions (e.g., based on training data and/or objective functions). The methods and processes may be at least partially determined by a set of trainable and/or otherwise dynamically adjustable parameters. Accordingly, the parameters for a particular method or process may be adjusted through any suitable training procedure, in order to continually improve functioning of the method or process.

Non-limiting examples of training procedures for adjusting parameters include supervised training (e.g., using gradient descent and/or any other suitable optimization method); zero-shot, few-shot, unsupervised learning methods (e.g., classification based on classes derived from unsupervised clustering methods); reinforcement learning (e.g., deep Q learning based on feedback) and/or generative adversarial neural network training methods; belief propagation; RANSAC (random sample consensus); contextual bandit methods; maximum likelihood methods; and/or expectation maximization.

In some examples, a plurality of methods, processes, and/or components of systems described herein may be trained simultaneously—e.g., based on comparison to an objective function that measures performance of collective functioning of the plurality of components (e.g., with regard to reinforcement feedback and/or with regard to labelled training data). Simultaneously training the plurality of methods, processes, and/or components may improve such collective functioning. In some examples, one or more methods, processes, and/or components may be trained independently of other components (e.g., offline training on historical data).

When included, display subsystem 806 may be used to present a visual representation of any or all data held by storage subsystem 804. As one example, the visual representation may take the form of a user interface that presents information to and optionally receives input from a human user. Display subsystem 806 may include one or more display devices utilizing virtually any suitable type of display technology.

When included, input subsystem 808 may comprise or interface with one or more input devices. Input devices may include user input devices and/or sensor input devices. Non-limiting examples of user input devices may include a keyboard, mouse, or touch screen. Input devices of the input subsystem may include integrated devices and/or peripheral devices.

When included, communication subsystem 810 may be configured to communicatively couple any or all components of computing system 800 with one or more other computer components—e.g., corresponding to other computing devices. Communication subsystem 810 may include wired and/or wireless communication devices compatible with any suitable data communication protocols. The communication subsystem may be configured for communication via personal-, local- and/or wide-area networks.

The invention claimed is:

1. A method for detecting discrepancies in a configuration of an electrical grid, the method comprising:

at a grid evaluation computing system, receiving network-communicated telemetry data from a plurality of grid monitoring devices of the electrical grid over a computer network;

generating a composite feature curve for a low-voltage transformer that combines two feature curves, and wherein the two feature curves comprise:

a first feature curve derived from a characteristic feature curve generated by a supervisory control and data acquisition (SCADA) device to which the low-voltage transformer is connected, according to a digital documented grid configuration; and a second feature curve derived from telemetry data reported by two or more power meters to which the low-voltage transformer is connected, according to the digital documented grid configuration;

estimating an apparent grid configuration of the electrical grid based at least in part on the network-communicated telemetry data, wherein the apparent grid configuration comprises the composite feature curve for the low-voltage transformer;

comparing the apparent grid configuration to the digital documented grid configuration of the electrical grid stored in computer storage, wherein the comparing comprises comparing the composite feature curve of the low-voltage transformer to feature curves of power meters to which the low-voltage transformer is connected;

outputting an indication of a potential discrepancy between the apparent grid configuration and the digital documented grid configuration based on the comparing; and utilizing the indication of the potential discrepancy to accurately maintain and renovate the electrical grid.

2. The method of claim 1, further comprising normalizing the network-communicated telemetry data by time-synchronizing first telemetry data from a first grid monitoring device with second telemetry data from a second grid monitoring device.

3. The method of claim 2, wherein time-synchronizing the first telemetry data with the second telemetry data includes identifying corresponding time-domain signal peaks in the first telemetry data and the second telemetry data, and time-shifting either or both of the first telemetry data and the second telemetry data to align the corresponding time-domain signal peaks.

4. The method of claim 1, further comprising normalizing the network-communicated telemetry data by identifying a gap in telemetry data reported by a grid monitoring device, and filling the gap with synthetic telemetry data derived from prior telemetry data received by the grid evaluation computing system.

5. The method of claim 1, wherein estimating the apparent grid configuration includes validating an electrical phase for one or more grid monitoring devices of the plurality of grid monitoring devices by verifying that an apparent electrical phase for the one or more grid monitoring devices based on the network-communicated telemetry data matches a recorded electrical phase for the one or more grid monitoring devices in the digital documented grid configuration.

6. The method of claim 5, wherein validating the electrical phase includes identifying the electrical phase for a grid monitoring device previously having no electrical phase recorded in the digital documented grid configuration.

7. The method of claim 1, further comprising sequentially generating updated characteristic feature curves for the plurality of grid monitoring devices over time.

8. The method of claim 1, wherein estimating the apparent grid configuration comprises:

comparing the characteristic feature curve for a low-voltage transformer of the plurality of grid monitoring devices to characteristic feature curves for one or more power meters of the plurality of grid monitoring devices; and assigning any of the one or more power meters having higher than a threshold similarity to the low-voltage transformer to a same meter-transformer cluster as the low-voltage transformer.

9. The method of claim 8, additionally comprising:

selecting the one or more power meters by identifying power meters having recorded geographic locations in the digital documented grid configuration falling within a threshold distance of a recorded geographic location of the low-voltage transformer in the digital documented grid configuration.

10. The method of claim 8, wherein comparing the apparent grid configuration to the digital documented grid configuration includes determining that a power meter of the one or more power meters assigned to the same meter-transformer cluster as the low-voltage transformer has a recorded geographic location in the digital documented grid configuration that is inconsistent with a recorded geographic location of the low-voltage transformer based on one or more geographical constraints.

11. The method of claim 10, wherein the indication of the potential discrepancy indicates that either or both of the recorded geographic location of the power meter and the recorded geographic location of the low-voltage transformer is inconsistent with the apparent grid configuration of the electrical grid.

12. The method of claim 10, further comprising comparing the characteristic feature curve for the power meter to characteristic feature curves for one or more other low-voltage transformers, and assigning the power meter to a meter-transformer cluster including a low-voltage transformer of the one or more other low-voltage transformers having higher than the threshold similarity with the power meter.

13. The method of claim 1, wherein the indication of the potential discrepancy indicates that a grid monitoring device is connected to a different electrical phase in the apparent grid configuration from a recorded electrical phase in the digital documented grid configuration, based at least in part on the network-communicated telemetry data.

14. The method of claim 1, wherein the indication of the potential discrepancy indicates that a first grid monitoring device connected to a second grid monitoring device in the apparent grid configuration is not recorded as being connected to the second grid monitoring device in the digital documented grid configuration.

15. The method of claim 1, wherein the network-communicated telemetry data includes any or all of voltages, electrical currents, geographic locations, unique identifiers, measured temperatures, and diagnostics codes reported by the plurality of grid monitoring devices.

16. A grid monitoring computing system, comprising:

a logic subsystem; and a storage subsystem holding instructions executable by the logic subsystem to:

receive network-communicated telemetry data from a plurality of grid monitoring devices of an electrical grid over a computer network;

generating a composite feature curve for a low-voltage transformer that combines two feature curves, and wherein the two feature curves comprise:

a first feature curve derived from a characteristic feature curve generated by a supervisory control and data acquisition (SCADA) device to which the low-voltage transformer is connected, according to a digital documented grid configuration; and a second feature curve derived from telemetry data reported by two or more power meters to which the low-voltage transformer is connected, according to the digital documented grid configuration;

estimate an apparent grid configuration of the electrical grid based at least in part on the network-communicated telemetry data, wherein the apparent grid configuration comprises the composite feature curve for the low-voltage transformer;

compare the apparent grid configuration to the digital documented grid configuration of the electrical grid stored in computer storage, wherein the comparing comprises comparing the composite feature curve of the low-voltage transformer to feature curves of power meters to which the low-voltage transformer is connected to obtain a comparison;

output an indication of a potential discrepancy between the apparent grid configuration and the digital documented grid configuration based on the comparison; and utilizing the indication of the potential discrepancy to accurately maintain and renovate the electrical grid.

17. A method for detecting discrepancies in a configuration of an electrical grid, the method comprising:

at a grid evaluation computing system, receiving network-communicated telemetry data from a plurality of grid monitoring devices of the electrical grid over a computer network;

based at least in part on the network-communicated telemetry data, generating characteristic feature curves for at least some grid monitoring devices of the plurality of grid monitoring devices, comprising generating characteristic feature curves for medium-voltage SCADA (supervisory control and data acquisition) devices, low-voltage transformers, and power meters of the plurality of grid monitoring devices;

generating a composite feature curve for a low-voltage transformer that combines two feature curves, and wherein the two feature curves comprise:

a first feature curve derived from a characteristic feature curve generated by a supervisory control and data acquisition (SCADA) device to which the low-voltage transformer is connected, according to a digital documented grid configuration; and a second feature curve derived from telemetry data reported by two or more power meters to which the low-voltage transformer is connected, according to the digital documented grid configuration;

estimating an apparent grid configuration of the electrical grid based at least in part on comparing the composite feature curve for the low-voltage transformer to characteristic feature curves for one or more power meters of the plurality of grid monitoring devices, and assigning any of the one or more power meters having higher than a threshold similarity to the low-voltage transformer to a same meter-transformer cluster as the low-voltage transformer;

determining that a power meter of the one or more power meters assigned to the same meter-transformer cluster as the low-voltage transformer has a recorded geographic location in the digital documented grid configuration that is inconsistent with a recorded geographic location of the low-voltage transformer in the digital documented grid configuration based on one or more geographical constraints;

outputting an indication that either or both of the recorded geographic location of the power meter and the recorded geographic location of the low-voltage transformer is inconsistent with the apparent grid configuration of the electrical grid; and utilizing the indication to accurately maintain and renovate the electrical grid.

\* \* \* \* \*